(12) United States Patent
Hasegawa

(10) Patent No.: US 7,720,663 B1
(45) Date of Patent: May 18, 2010

(54) DELAY ANALYSIS SYSTEM

(75) Inventor: Takumi Hasegawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/273,560

(22) Filed: Mar. 22, 1999

(30) Foreign Application Priority Data

Mar. 27, 1998 (JP) ............................. 10-100474

(51) Int. Cl.
G06F 17/50 (2006.01)
(52) U.S. Cl. ............................................ 703/14; 716/6
(58) Field of Classification Search ................. 703/14, 703/19, 18, 15, 2, 13; 716/6, 8, 18; 714/55, 714/24, 37; 702/125, 89, 79, 58, 117; 364/489
See application file for complete search history.

(56) References Cited

U.S. PATENT DOCUMENTS

| 4,698,760 A | * | 10/1987 | Lembach | 716/6 |
| 5,274,568 A | * | 12/1993 | Blinne | 716/6 |
| 5,528,511 A | * | 6/1996 | Hasegawa | 716/6 |
| 6,024,478 A | * | 2/2000 | Yamamoto | 716/5 |
| 6,041,168 A | * | 3/2000 | Hasegawa | 716/6 |
| 6,047,247 A | * | 4/2000 | Iwanishi et al. | 702/117 |

FOREIGN PATENT DOCUMENTS

| JP | 1-271869 | 10/1989 |
| JP | 05-205004 | 8/1993 |
| JP | 06-295324 | 10/1994 |
| JP | 07-249060 | 9/1995 |
| JP | 07-282095 | 10/1995 |
| JP | 08-63499 | 3/1996 |
| JP | 09-259170 | 10/1997 |

OTHER PUBLICATIONS

Jun, et al. "An accurate and efficient multidelay simulator for MOS Logic Circuits Using Polynomial Approximation", IEEE International Symposium on Circuits and Systems, 1988, pp. 2117-2120.*
Edmatsu et al. " Pre-layout calculation specification for CMOS ASIC Libraries", Proceedings of the Asia Pacific Design Automation Conference, Feb. 1998, pp. 241-248.*
Pratapneni, et al. "Comparison of driver models for the computer aided analysis of Electronic packages", Electircal Performance and Electronic Packaging, Oct. 1993, pp. 199-201.*

* cited by examiner

Primary Examiner—Paul L Rodriguez
Assistant Examiner—Kandasamy Thangavelu
(74) Attorney, Agent, or Firm—Sughrue Mion, PLLC

(57) ABSTRACT

The present invention provides a delay analysis system which makes it possible to make delay analysis considering circuit logical information in order to give more accurate delay times. In addition to circuit connection information and delay time information on the rises and falls of the input and output terminals of the circuits which are stored in a delay analysis library, the delay analysis system according to the present invention contains, in the library, logical operation information which represents correspondence between the logical values of each input terminal and their output logical values of the circuits. When making the delay analysis of a logic circuit, the system selects, for each circuit included in the logic circuit, a delay time between an input terminal and an output terminal from the delay time information on the rises and falls of the input and output terminals of the basic circuits, stored in the library, according to the logical operation of the circuit in order to calculate the delay time of the circuit.

4 Claims, 5 Drawing Sheets

| INPUT PIN | OUTPUT PIN | RISE/FALL OF INPUT | RISE/FALL OF OUTPUT | DELAY TIME (ns) |
|---|---|---|---|---|
| TERMINAL 1 | TERMINAL 3 | rise | rise | 1 |
| TERMINAL 1 | TERMINAL 3 | rise | fall | 2 |
| TERMINAL 1 | TERMINAL 3 | fall | rise | 3 |
| TERMINAL 1 | TERMINAL 3 | fall | fall | 4 |
| TERMINAL 2 | TERMINAL 3 | rise | rise | 5 |
| TERMINAL 2 | TERMINAL 3 | rise | fall | 6 |
| TERMINAL 2 | TERMINAL 3 | fall | rise | 7 |
| TERMINAL 2 | TERMINAL 3 | fall | fall | 8 |

| TERMINAL 1 \ TERMINAL 2 | 0 | 1 |
|---|---|---|
| 0 | 0 | 0 |
| 1 | 0 | 1 |

| RISE/FALL OF INPUT | BOTH INPUTS RISE | Rise/fall | BOTH INPUTS FALL |
|---|---|---|---|
| INPUT 1 | ⎿⎺ | ⎿⎺ | ⎺⎿ |
| INPUT 2 | ⎿⎺ | ⎺⎿ | ⎺⎿ |
| OUTPUT | ⎿⎺ | ⎿⎺⎿ | ⎺⎿ |
| DELAY CAUSED BY: INPUT | INPUT RISING LATER | NONE | INPUT FALLING EARLIER |

FIG. 4

| OUTPUT | SELECTED INPUT |
|---|---|
| Rise | INPUT RISING LATER |
| Fall | INPUT FALLING EARLIER |

DELAY ANALYSIS SYSTEM

FIELD OF THE INVENTION

The present invention relates to a system for analyzing a delay in a logic circuit device, and more particularly to a library for delay analysis.

BACKGROUND OF THE INVENTION

When calculating a delay in a logic circuit in a conventional delay simulation system, a delay analysis library containing circuit connection information and delay information on the basic elements (such as AND elements) of the circuit is used.

The conventional delay analysis library contains connection information as well as delay information which is composed of the delay time of each rise and fall. But, it does not contain logic information on the circuit.

For this reason, the circuit delay analysis uses the worst delay times stored in the delay analysis library, sometimes preventing the delay analysis from being made correctly.

An earlier patent disclosure dealing with delay analysis is found, for example, in Japanese Patent Kokai Publication JP-A No. Hei 1-271869 (1989). In that publication, a propagation delay time calculation method for use in calculating propagation delay times is proposed. In this method, the calculation is made by calculating the load and wiring capacity of the output terminals and the rise time and fall time of each gate.

SUMMARY OF THE DISCLOSURE

During the eager investigation toward the present invention, following problems have been encountered.

As described above, the conventional delay analysis library, in which no logic value table is stored, contains information on the worst delay times for use in delay time analysis. As shown in FIG. 7, the calculation with the use of such a library results in the total delay time of 28 ns being assumed for the signal flowing through terminal 2 (The delay time between input terminal 2 and the output terminal 3 is 8 ns.). (As will be described later, the actual delay time is 24 ns.)

In view of the foregoing, it is an object of the present invention to provide a delay analysis system and a delay analysis method for analyzing delays and calculating delay times considering circuit logic information.

To achieve the above object, the delay analysis library in accordance with the present invention contains not only connection information on a plurality of circuits and delay time information on the rises and falls of the input and output terminals but also logic information on the logic operation of said plurality of circuits.

When making the delay analysis of a logic circuit, the system in accordance with the present invention selects a delay time information according to the logic operation of the circuits included in the logic circuit, the delay time being between the input terminals and output terminals of the circuits, from the library which contains the delay time information on the rises and falls of the input terminals and output terminals.

BRIEF DESCRIPTION OF THE DRAWINGS

FIG. 1 shows the diagrams illustrating a delay analysis library used in an embodiment of the present invention.

FIG. 4 is a diagram showing the embodiment of the present invention.

DESCRIPTION OF PREFERRED EMBODIMENT

An embodiment of the present invention will now be described more in detail. In a system where a delay analysis library is used in which circuit connection information on the basic circuits such as combinational circuits composed of AND elements, OR elements, NAND elements, and NOR elements and other sequential circuits and delay time information on the rises and falls of the input and output terminals of the basic circuits are stored, the preferred embodiment of the present invention also contains, in the library, logical operation information which represents a correspondence between the logical values of each input terminal and their output logical values of the basic circuit.

When making the delay analysis of a logic circuit, the delay analysis system according to the present invention selects, for each basic circuit of the logic circuit, the delay time between an input terminal and an output terminal from the delay time information on the rises and falls of the input and output terminals of the basic circuit, stored in the library, according to the logical operation of the basic circuit specified by the logical operation information. The system uses the delay time of the basic circuit, which is obtained in this manner, in calculating the delay time of the logical circuit.

The delay analysis system according to the present invention, which references the library to select the delay time of a circuit logical operation and calculates the delay of a logic circuit using the selected delay time, may be implemented by a computer-executable program.

Thus, in the embodiment according to the present invention, delay analysis considering the truth table may be made to calculate more accurate delay times.

EXAMPLE

An embodiment of this invention will now be described more in detail with reference to the drawings.

Figures 1A, 1B, 1C:
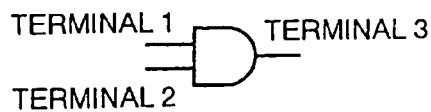
FIG. 1(a) shows circuit connection information.
FIG. 1(b) shows delay time information on the rise and fall of the input terminals and output terminals.
FIG. 1(c) shows logic information (truth table).

FIG. 1 illustrates an embodiment of the present invention. In the following description, the library for a 2-input AND element, such as the one shown in FIG. 1(a), is used as the basic gate circuit.

The library contains information on circuit connections and on the delay time for each rise/fall combination. That is, it contains information on the delay time of each combination of input pins 1 and 2 (terminals 1 and 2) and output pin 3 (terminal 3).

The table shown in FIG. 1(b) represents delay times for the combinations of an input pin and an output pin as they rise or fall. For example, on the first line, the delay time of 1 ns means that the delay between the time the signal at the input pin (terminal 1) of a 2-input AND element goes from low to high (rises) and the time the signal at the output pin (terminal 3) goes from low to high (rises) is 1 ns. Similarly, on the fifth line, the delay time of 5 ns means that the delay between the time the signal at the input pin (terminal 2) of a 2-input AND element goes from low to high (rises) and the time the signal at the output pin (terminal 3) goes from low to high (rises) is 5 ns. Note that delay time information on the rise and fall of input and output pins, such as that shown in FIG. 1(b), is contained also in the conventional delay analysis library.

An embodiment according to the present invention uses a truth table (table showing the correspondence between input logical values and output logical values) such as the one shown in FIG. 1(c).

Consider the logic circuit composed of the 2-input AND circuit shown in the library in FIG. 1 and its peripheral circuits.

The operation of the 2-input AND circuit is as shown in the truth table in FIG. 1(c). The operation is shown also in FIG. 3 using the timing waveforms and the inputs having change points to be considered when calculating the delay time.

Figures 2, 3:
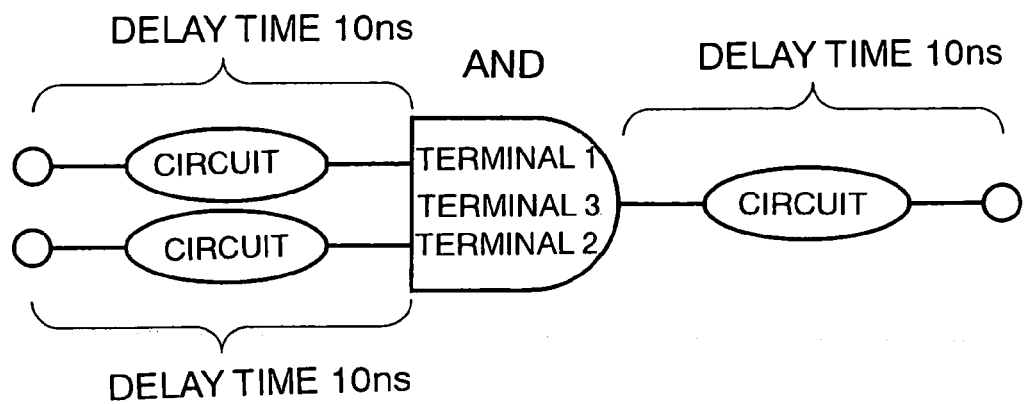
FIG. 2 is a diagram showing the embodiment of the present invention. The figure shows an example of a logic circuit.
FIG. 3 is a diagram illustrating the embodiment of the present invention. The figure is a waveform diagram showing the rise and fall delay patterns of a 2-input AND circuit.

The inputs to be selected and their rises/falls are selected from those shown in FIG. 3 for each of the rise and the fall of the output signal at the output pin (terminal 3). The result is shown in FIG. 4.

That is, FIG. 3 indicates that the output (terminal 3) rises when both inputs 1 and 2 (terminals 1 and 2) of the 2-input AND element rise. At that time, the output rises when one of the inputs which rises later rises. That is, for the 2-input AND element, the delay between the time input 1 (terminal 1) rises and the time the output (terminal 3) rises is 1 ns, and the delay between the time input 2 (terminal 2) rises and the time the output (terminal 3) rises is 5 ns. When both input 1 and input 2 rise, the output (terminal 3) rises when terminal 2 rises. Thus, when making a delay analysis, terminal 2 with the delay time of 5 ns is selected as the terminal which rises later.

When inputs 1 and 2 (terminals 1 and 2) of the 2-input AND element fall, the output (terminal 3) fall. At that time, the output falls when one of the inputs which falls earlier falls. That is, when input 1 (terminal 1) falls, the delay time of the output (terminal 3) is 4 ns; when input 2 (terminal 2) falls, the delay time of the output (terminal 3) is 8 ns. Thus, when making a delay analysis, terminal 1 with the delay time of 4 ns is selected as the terminal which falls earlier. When inputs 1 and 2 are rise/fall, no terminal is selected for delay analysis.

From the combinations of inputs shown in FIG. 1(b), those inputs which both rise or fall are selected. They are enclosed by boxes in FIG. 5.

Next, the calculation of the maximum delay time between the input and the output of the whole circuit through the analysis of the logic circuit shown in FIG. 2 is described. This requires the tracing of the circuit. In this embodiment, the DFS (Depth First Search) used in the graph theory is used as the trace technology.

The following describes the calculation of the maximum delay time in two cases: one is the case when the signal at the output terminal (terminal 3) of the 2-input AND circuit rises and the other is the case when it falls.

First, when the signal at the output terminal (terminal 3) rises, the flow of the signal through terminal 2 which rises later (delay time of 5 ns) is used based on the description in FIGS. 4 and 5. As a result, the total delay time (worst value) from the input to the output of the circuit is calculated at 25 ns (10 ns+5 ns+10 ns) as shown in FIG. 6.

Figure 5:
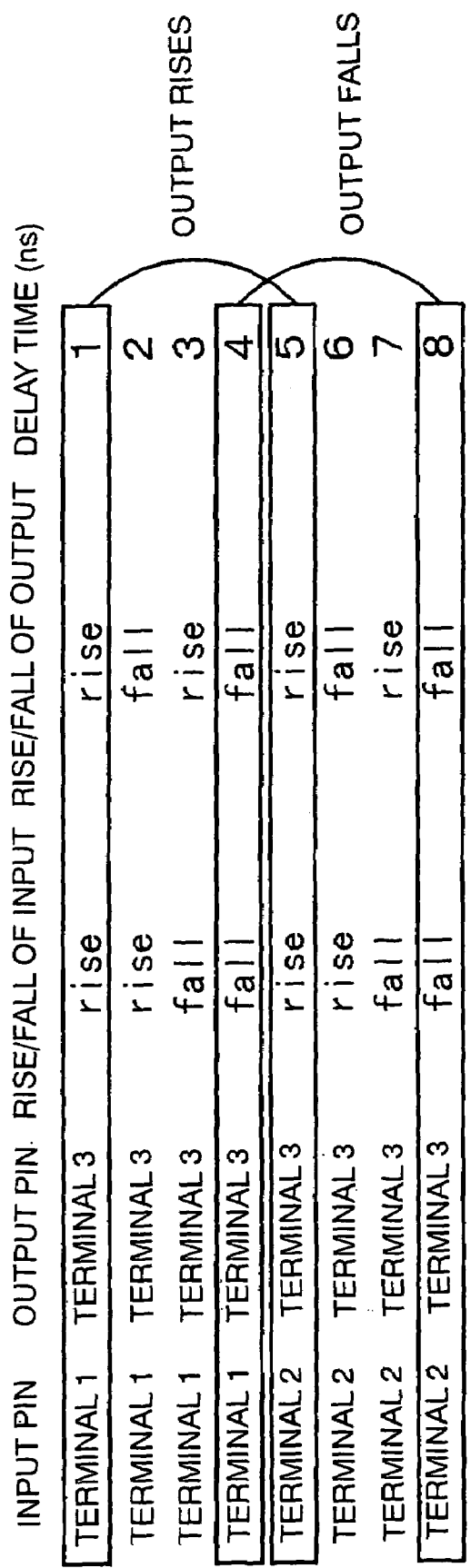
FIG. 5 is a diagram showing the embodiment of the present invention.
Figure 6:
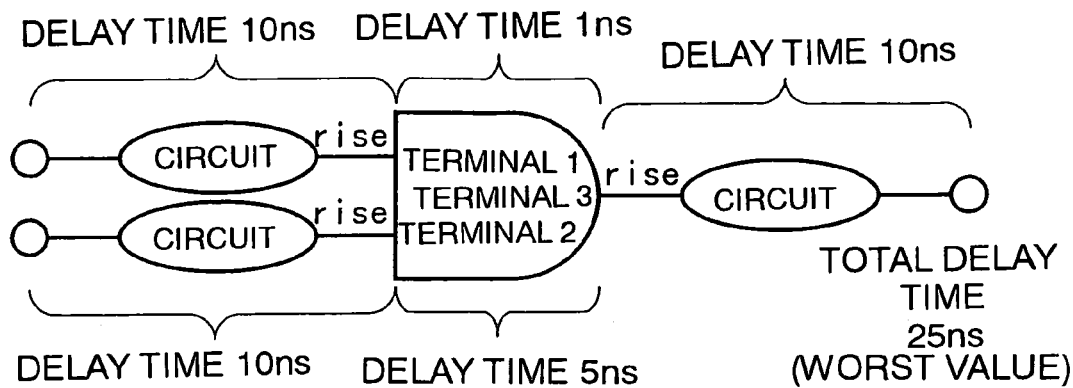
FIG. 6 is a diagram showing the embodiment of the present invention. It shows the delay analysis result of the logic circuit shown in FIG. 2.
Figure 7:
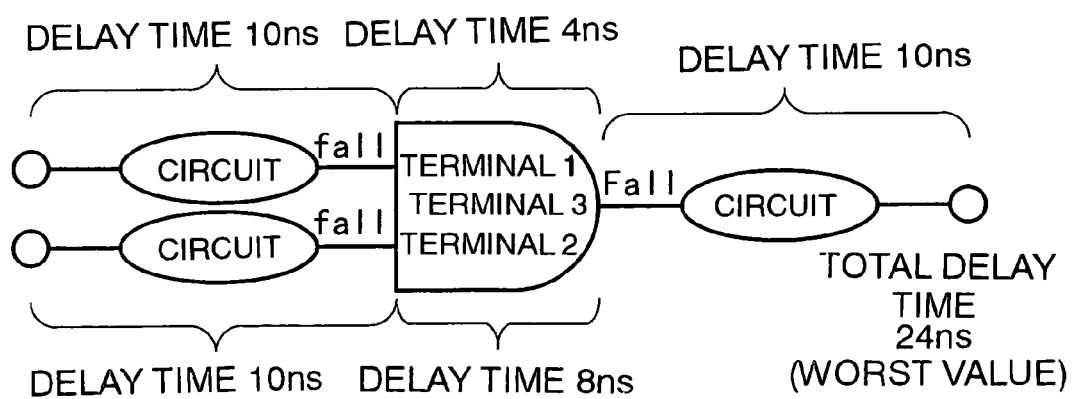
FIG. 7 is a diagram showing the embodiment of the present invention. It shows the delay analysis result of the logic circuit shown in FIG. 2.

On the other hand, when the signal at the output terminal (terminal 3) falls, the flow of the signal through terminal 1 which falls earlier (delay time of 4 ns) is used based on the description in FIGS. 4 and 5. As a result, the total delay time (worst value) is calculated at 24 ns (10 ns+4 ns+10 ns) as shown in FIG. 7.

The present invention also applies when calculating the minimum delay time.

As described above, the embodiment according to the present invention uses the truth table when making a delay analysis with the use of a delay analysis library, thereby giving more accurate delay times.

It should be noted that other objects of the present invention will become apparent in the entire disclosure and that modifications may be done without departing the gist and scope of the present invention as disclosed herein and appended herewith.

Also it should be noted that any combination of the disclosed and/or claimed elements, matters and/or items may fall under the modifications aforementioned.

What is claimed is:

1. A delay analysis system, executed on a computer, for making a delay analysis of a logic circuit, said delay analysis system comprising:

a delay analysis library comprising:

connection information and delay time information on rises and falls of input and output terminals for a plurality of circuits; and for at least one circuit of said plurality of circuits, logical operation information between each input terminal and an output terminal of the logic circuit, the logical operation information being specified in a truth table in the library;

a delay analyzing module which computes delay times of the plurality of the circuits based on information in the delay analysis library, wherein delay time for a signal path from input terminals to an output terminal of a logical circuit of said at least one circuit is computed based upon logical state transitions at said input terminals and a resulting logical state transition at said output terminal corresponding to the logical operation information, wherein the delay time for a signal path from the input terminals to the output terminal of a logical circuit is computed by:

computing a sum of input terminal delay, delay between the input terminals and the output terminal and the output terminal delay for each combination of input and output terminals; and selecting the delay time from the input terminals to the output terminal of the logical circuit from said sums of delays, wherein if a selected output terminal transitions from a low state to a high state, said delay time is selected based on an input terminal whose logical transition triggers said low state to said high state transition at said selected output terminal according to the logical operation information, or if said selected output terminal transitions from a high state to a low state, said delay time is selected based on an input terminal whose logical transition triggers said high state to said low state transition at said selected output terminal according to the logical operation information, wherein the delay analyzing module automatically computes the delay of the logical circuit based on the delay time information and the logical operation information in said delay analysis library.

2. A delay analysis system, executed on a computer, for making a delay analysis of a logic circuit, said system comprising:
- a delay analysis library comprising:
  - connection information and delay time information on rises and falls of input and output terminals for a plurality of circuits; and
  - for each of said plurality of circuits, logical operation information between each input terminal and an output terminal of the logic circuit, the logical operation information being specified in a truth table in the library;
- a delay analyzing module which computes delay times of the plurality of the circuits based on information in the delay analysis library,
- wherein, respective delay time for a signal path from input terminals to an output terminal of a respective logical circuit of each of said plurality of circuits is computed based upon logical state transitions at said input terminals and a resulting logical state transition at said output terminal corresponding to the respective logical operation information,
- wherein the delay time for a signal path from the input terminals to the output terminal of the respective logical circuit is computed by:
- computing a sum of input terminal delay, delay between the input terminals and the output terminal and the output terminal delay for each combination of input and output terminals; and
- selecting the delay time from the input terminals to the output terminal of the respective logical circuit from said sums of delays, wherein if a selected output terminal transitions from a low state to a high state, said delay time is selected based on an input terminal whose logical transition triggers said low state to said high state transition at said selected output terminal according to the logical operation information, or if said selected output terminal transitions from a high state to a low state, said delay time is selected based on an input terminal whose logical transition triggers said high state to said low state transition at said selected output terminal according to the logical operation information,
- wherein the delay analyzing module automatically computes the delay of the respective logical circuit of each of said plurality of circuits based on the respective delay time information and the logical operation information in said delay analysis library.

3. A computer-implemented method of making a delay analysis of a logical circuit, comprising:
- referencing, using a computer, a delay analysis library for at least one circuit among a plurality of circuits, said delay analysis library comprising:
  - connection information, delay time information on rises and falls of input and output terminals for said plurality of circuits; and
  - for the at least one circuit among the plurality of circuits, logical operation information between each input terminal and an output terminal of the logic circuit, the logical operation information being specified in a truth table in the library;
- computing by a delay analyzing module delay times for the at least one circuit of the plurality of the circuits based on information in the delay analysis library,
- wherein, delay time for a signal path from input terminals to an output terminal for the at least one circuit among a plurality of circuits is computed based upon logical state transitions at said input terminals and a resulting logical state transition at said output terminal corresponding to the logical operation information,
- wherein the delay time for a signal path from the input terminals to the output terminal for the at least one circuit among a plurality of circuits is computed by:
- computing a sum of input terminal delay, delay between the input terminals and the output terminal and the output terminal delay for each combination of input and output terminals; and
- automatically selecting a delay time from said sums of delays, wherein if a selected output terminal transitions from a low state to a high state, said delay time is selected based on an input terminal whose logical transition triggers said low state to said high state transition at said selected output terminal according to the logical operation information, or if said selected output terminal transitions from a high state to a low state, said delay time is selected based on an input terminal whose logical transition triggers said high state to said low state transition at said selected output terminal according to the logical operation information.

4. A computer-readable medium having stored thereon a program comprising computer instructions that, when executed on a computer, perform a process for executing a delay analysis method for a logic circuit, said computer-readable medium causing a computer to execute said method, wherein said method comprises:
- referencing a delay analysis library for at least one circuit among a plurality of circuits, said delay analysis library comprising:
  - connection information, delay time information on rises and falls of input and output terminals for said plurality of circuits; and
  - for the at least one circuit among the plurality of circuits, logical operation information between each input terminal and an output terminal of the logic circuit, the logical operation information being specified in a truth table in the library;
- computing by a delay analyzing module delay times for the at least one circuit of the plurality of the circuits based on information in the delay analysis library,
- wherein, delay time for a signal path from input terminals to an output terminal for the at least one circuit among a plurality of circuits is computed based upon logical state transitions at said input terminals and a resulting logical state transition at said output terminal corresponding to the logical operation information,
- wherein the delay time for a signal path from the input terminals to the output terminal for the at least one circuit among a plurality of circuits is computed by:
- computing a sum of input terminal delay, delay between the input terminals and the output terminal and the output terminal delay for each combination of input and output terminals; and
- automatically selecting a delay time from said sums of delays, wherein if a selected output terminal transitions from a low state to a high state, said delay time is selected based on an input terminal whose logical transition triggers said low state to said high state transition at said selected output terminal according to the logical operation information, or if said selected output terminal transitions from a high state to a low state, said delay time is selected based on an input terminal whose logical transition triggers said high state to said low state transition at said selected output terminal according to the logical operation information.

* * * * *